United States Patent [19]

Bullock

[11] Patent Number: 5,094,584
[45] Date of Patent: Mar. 10, 1992

[54] METHOD AND APPARATUS FOR AUTOMATICALLY CHANGING PRINTED CIRCUIT BOARD TEST FIXTURES

[75] Inventor: Michael L. Bullock, Loveland, Colo.

[73] Assignee: Hewlett-Packard Company, Palo Alto, Calif.

[21] Appl. No.: 608,784

[22] Filed: Nov. 5, 1990

Related U.S. Application Data

[62] Division of Ser. No. 335,061, Apr. 6, 1989.

[51] Int. Cl.$^5$ .............................................. B65G 1/04
[52] U.S. Cl. .................................. 414/786; 414/280; 324/158 F
[58] Field of Search ............... 414/280, 331, 286, 222, 414/273, 274, 275, 277, 281, 282, 283; 324/158 F

[56] References Cited

U.S. PATENT DOCUMENTS

| | | | |
|---|---|---|---|
| 4,558,983 | 12/1985 | Freeman et al. | 414/280 X |
| 4,614,474 | 9/1986 | Sudo | 414/280 X |
| 4,725,182 | 2/1988 | Sukamoto et al. | 414/280 X |
| 4,776,745 | 10/1988 | Foley | 414/286 X |
| 4,818,933 | 4/1989 | Kerschner et al. | 324/158 F |
| 4,824,311 | 4/1989 | Mims | 414/280 X |
| 4,844,680 | 7/1989 | Kawata et al. | 414/331 |
| 4,871,290 | 10/1989 | Kaczynski et al. | 414/331 |

FOREIGN PATENT DOCUMENTS

| | | | |
|---|---|---|---|
| 302542 | 2/1989 | European Pat. Off. | 414/331 |
| 1756427 | 4/1970 | Fed. Rep. of Germany | 414/280 |
| 244441 | 10/1986 | Japan | 414/222 |

Primary Examiner—Frank E. Werner

[57] ABSTRACT

The automated changer for printed circuit board test fixtures includes apparatus for transporting printed circuit board test fixtures between a printed circuit board test fixture storage apparatus and a printed circuit board test facility. The automated changer also includes apparatus that automatically unlocks and retrieves a test fixture from the printed circuit board test facility and automatically loads another test fixture in its place. In operation, the automated changer retrieves a selected printed circuit board test fixture from a storage apparatus and transports the retrieved printed circuit board test fixture to the printed circuit board test facility. The automated changer orients one of its printed circuit board test fixture retrieval arms in juxtaposed position with a printed circuit board test fixture loading aperture in the test facility. The automated changer unlocks and then retrieves the printed circuit board test fixture that is presently loaded in the test facility via the aperture. The automated changer then positions the printed circuit board test fixture that was retrieved from the storage apparatus opposite the aperture in the test facility. The printing circuit board test fixture retrieval arm automatically loads the retrieved printed circuit board test fixture into the test facility via the aperture in the test facility and locks the test fixture in place. The automated changer then replaces the printed circuit board test fixture that was initially retrieved from the test facility in a designated location in the storage apparatus. Thus, the automated changer efficiently and accurately loads and unloads printed circuit board test fixtures both in an associated test facility and in an associated storage apparatus.

15 Claims, 7 Drawing Sheets

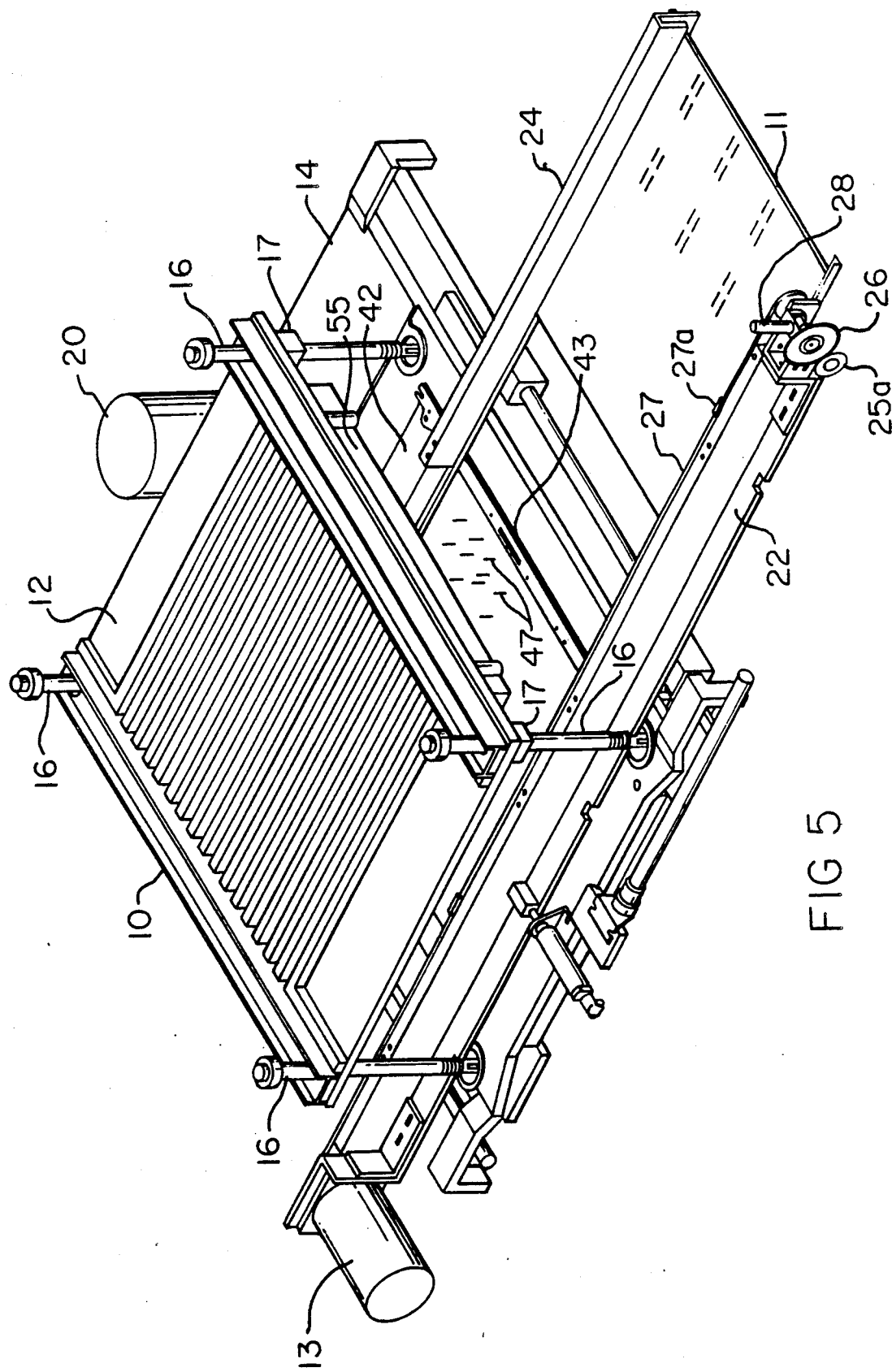

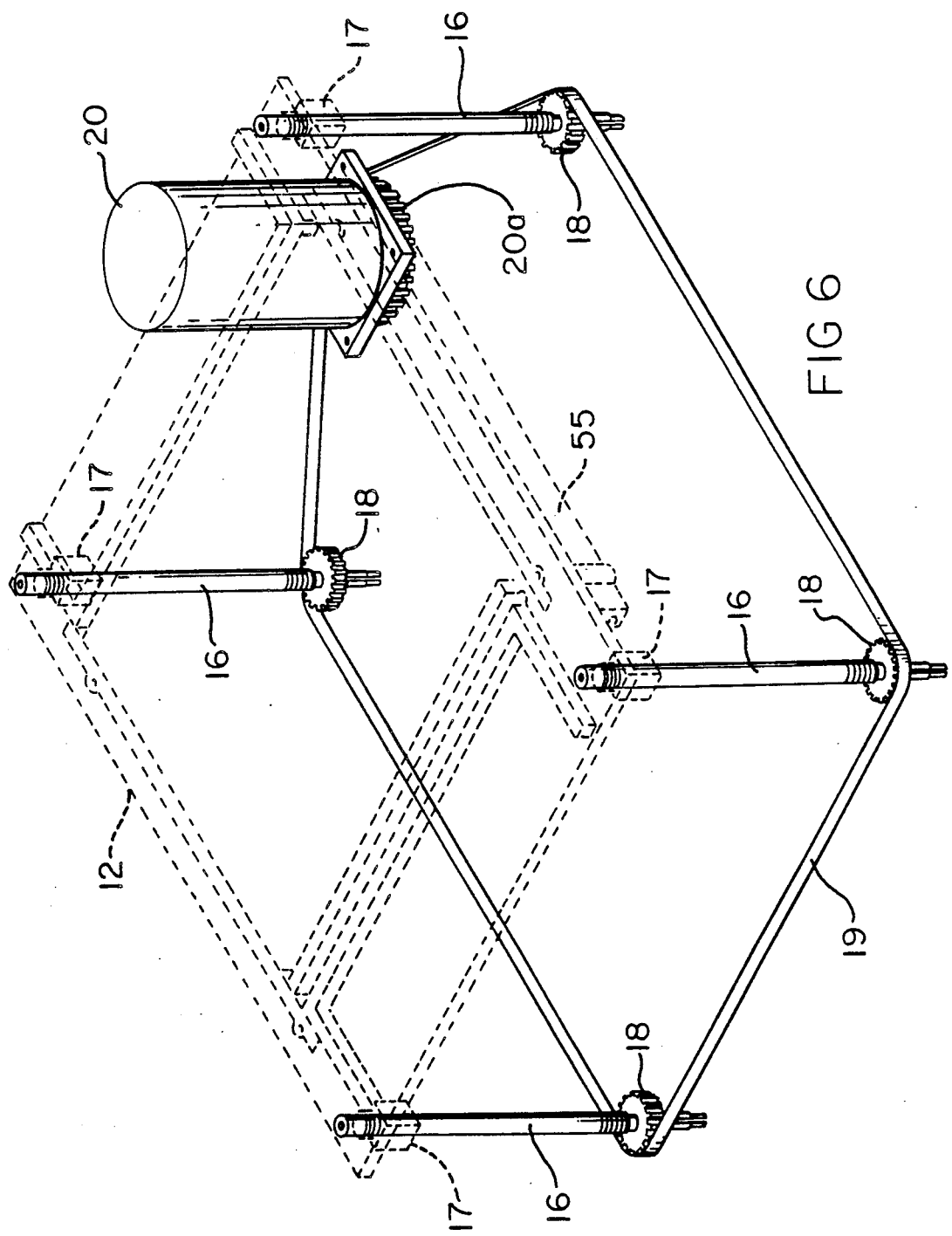

ism. The test fixture transport mechanism transports
METHOD AND APPARATUS FOR AUTOMATICALLY CHANGING PRINTED CIRCUIT BOARD TEST FIXTURES This is a division of application Ser. No. 07/335,061, filed Apr. 6, 1989.

CROSS REFERENCE TO RELATED APPLICATIONS

This application is related to the U.S. patent application Ser. No. 06/916,667 entitled "Board Fixturing System" filed Oct. 8, 1986.

FIELD OF THE INVENTION

This invention relates to techniques for handling printed circuit board test fixtures and more particularly to techniques, apparatus, and systems for automated loading/unloading test fixtures in a printed circuit board test facility.

PROBLEM

It is a problem in the field of printed circuit board test systems to efficiently change the printed circuit board test fixtures that are used to test an associated code of printed circuit board each time a new code of printed circuit board enters the test facility. Printed circuit board test fixtures must be changed each time that the manufacturer alters the code of printed circuit boards being tested. With the advent of just-in-time manufacturing, which requires that circuit boards be manufactured as needed to reduce inventories, the frequency of these changes in printed circuit board codes can be high.

After printed circuit boards have been manufactured, and before they can be used or placed into assembled products, they must be tested to verify that all required electrical connections have been properly completed and that all necessary electrical components have been attached or mounted to the printed circuit board in proper position and with proper orientation. Other reasons for testing are to determine and verify whether the proper components have been used and whether they are of the proper value. It is also necessary to determine whether each component performs properly (i.e., in accordance with the specification). Some electrical components also may require adjustment after installation.

Typically in the prior art, a circuit board test fixturing system allows for the changing of printed circuit boards under test by means of a conveyor, which transports the printed circuit board to the probing means of the test system. This type of circuit board test fixturing system requires manual handling of the test fixture under test in order to change for a different circuit board, which is an inefficient and time consuming process. Furthermore, this type of circuit board test fixturing system is bulky, heavy, and not suitable for simple handling.

In addition, the scanners that prior art fixtures fit into, require many motions that make automation of fixture changing difficult.

Further, fixtures that use universal probes in a grid array require awkward changing of model plates to accommodate changing board types. These motions are not suitable for automating the change procedure.

SOLUTION

The foregoing problems are solved and a technical advance achieved in the field by the automated changer for printed circuit board test fixtures of this invention. This automated changer system includes three major subsystems: a test fixture storage apparatus, a test fixture transport mechanism, and a test fixture install mechanism. The test fixture transport mechanism transports printed circuit board test fixtures between a printed circuit board test fixture storage apparatus and a printed circuit board test facility. The automated changer also includes a test fixture install mechanism that automatically unlocks and retrieves a test fixture from the printed circuit board test facility and loads another test fixture in its place. Thus, the entire test fixture exchange procedure is automated, and rapidly executed.

In operation, the automated changer system test fixture transport mechanism retrieves a selected printed circuit board test fixture from a test fixture storage apparatus and transports the retrieved printed circuit board test fixture to the printed circuit board test facility. The automated changer system orients one of its printed circuit board test fixture retrieval arms in juxtaposed position with a printed circuit board test fixture loading aperture in the test facility. The automated changer system test fixture install mechanism unlocks and then presents the printed circuit board test fixture that is presently loaded in the test facility via the test fixture loading aperture to the transport mechanism. The automated changer system test fixture transport mechanism then positions the printed circuit board test fixture that was retrieved from the test fixture storage apparatus opposite the test fixture loading aperture in the test facility. The printed circuit board test fixture retrieval arm automatically loads the retrieved printed circuit board test fixture into the test facility via the test fixture loading aperture in the test facility. The test fixture install mechanism completes the installation and locks the test fixture in place. The automated changer then replaces the printed circuit board test fixture that was initially retrieved from the test facility in a designated location in the test fixture storage apparatus. Thus, the automated changer system efficiently and accurately loads and unloads printed circuit board test fixtures both in an associated printed circuit board test facility and in its test fixture storage apparatus.

The automated changer for printed circuit board test fixtures of the present invention thereby allows and assists rapid automatic fixture change of an automatic board tester. The present invention utilizes a simple sliding motion for fixture removal and insertion such that the process is accomplished more quickly and efficiently; automated unlatching and connecting of the fixture to the scanner is provided; and the fixturing cassettes used are economical and easy to store. Also, there is no manual handling required of multiple fixture plates which reduces time and labor of the test process. Further, the time required to change fixtures is reduced considerably by having a new fixture ready and waiting to be installed while the old one is being retrieved from the tester, thus increasing throughput of the apparatus. The present invention therefore, is an integrated system which allows automatic test fixture change, fixture storage, removal and insertion in a testing apparatus.

BRIEF DESCRIPTION OF THE DRAWINGS

FIG. 5 is a perspective view of one embodiment of fixturing apparatus of this invention without the test fixture inserted therein;

FIG. 6 is a perspective view illustrating the manner in which the upper section of the fixture (which is adapted to hold the upper probe plate) is adapted to be moved vertically in the fixture;

DETAILED DESCRIPTION OF THE INVENTION

Fixturing Apparatus

Figure 1:
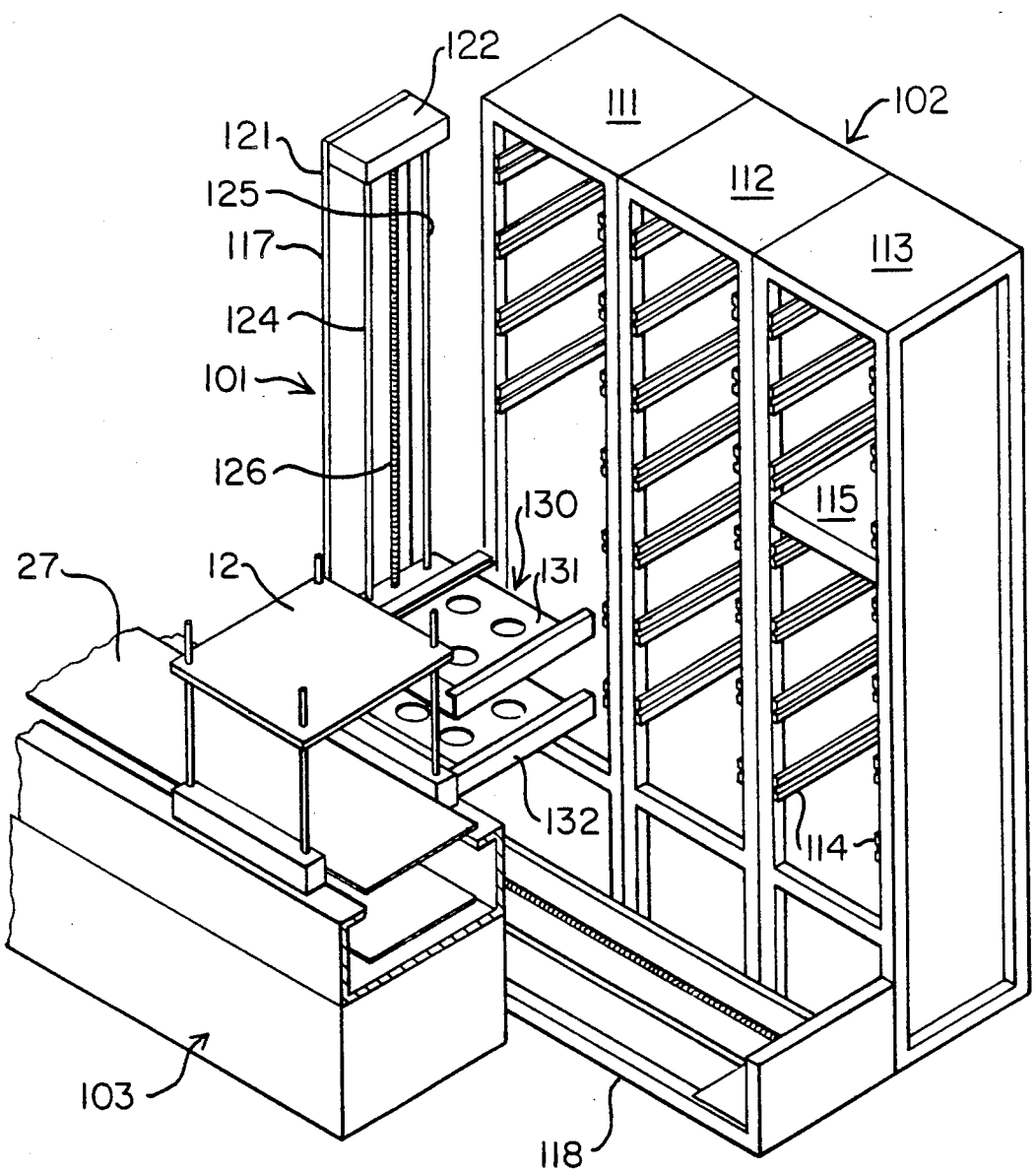
FIG. 1 illustrates a perspective view of one embodiment of the automated changer for printed circuit board test fixtures.

FIG. 1 illustrates the automated changer system for printed circuit board test fixtures in perspective view. A printed circuit board test facility 103 is shown in FIG. 1 to illustrate the environment in which the automated changer system operates. Only a portion of the printed circuit board test facility 103 is illustrated in FIG. 1. The portion of the printed circuit board test facility 103 that is shown in FIG. 1 is the printed circuit board fixturing apparatus of the printed circuit board test facility 103. This apparatus is described in a co-pending patent application entitled "Board Fixturing System" filed Oct. 8, 1986 and assigned Ser. No. 06/916,667, now U.S. Pat. No. 4,818,933. The above referenced application discloses a latching mechanism and allows the handling of a two piece fixture as one. The operation of this board fixturing system is described herein only insofar as it relates to the operation of the automated changer system for printed circuit board test fixtures of this invention. Additional details of implementation of the printed circuit board fixturing apparatus may be obtained by reading of the above referenced co-pending patent application.

In FIG. 5 there is shown a perspective view of a typical fixturing apparatus 10. The test fixtures used in fixturing apparatus 10 in this embodiment are a one piece test fixture that is in the form of a cassette (shown in FIG. 8). The cassette is operable to be separated into two halves—an upper probe plate 40 and a lower probe plate 42. In a transport or storage mode, the two halves of the test fixture are latched together. The automatic test fixture changer system is operable to latch/unlatch and load/unload these test fixtures in the test facility 103 as is described below. The fixturing apparatus 10 includes a frame having upper section 12 and lower section 14 connected at the corners by means of upright members 16. A conveyor 27 comprising parallel rails 22 and 24 are supported by lower section 14 of the frame. The belt of the conveyor 27 is powered by motor 13 and is adapted to convey a printed circuit board 11 to be tested from a position outside the frame to a test position within the frame between the upper section 12 and lower section 14 of the frame member and then to a position outside the frame member again.

An upper probe plate 40 is attached to upper section 12. A lower probe plate 42 is designed to be securely and firmly attached to a support structure. For example, when the test fixture is positioned and supported on a test head it is secured to the test head. The lower probe plate 42 is detachably secured to the test head when the lower probe plate 42 is placed into proper position for testing. One manner of detachably securing upper probe plate 40 to upper section 12 is by the use of a plurality of pins 55. The pins 55 are L-shaped in that the lower end of the pin is bent perpendicularly to the main shank of pin 55. The L-shaped end of pin 55 is adapted to be received in an appropriately shaped groove in upper probe plate 40. When upper section 12 is raised to its uppermost position, pins 55 move downwardly and out of the groove or notch in upper probe plate 40. This enables upper probe plate 40 to slide in or out of the test fixture frame 10.

Each probe plate 40, 42 which is used in the apparatus of this invention includes probing means 47 which are adapted to send and receive electronic signals to and from predetermined locations on the printed circuit board 11 being tested when the printed circuit board 11 is in electrical contact with the probing means 47. The type of probing means 47 used may be conventional, e.g., such as those available from Pylon, QA Technology, Contact Products, etc.

The upper probe plate 40 is adapted to be lowered and biased against the upper surface of a printed circuit board 11 being tested. In FIG. 5 the upright members 16 are threaded along substantially their entire length and are each rotatably supported in a bearing carried by lower section 14 of the frame. The upper section includes threaded holes in blocks 17 in which the threaded upright members are received. Thus, when the upright members are rotated in one direction the upper section 12 is lowered, and when the upright members are rotated in the opposite direction the upper section is raised.

In this manner the upper probe plate 40 is lowered into position over the printed circuit board 11 to be tested. With further rotation of the upright members the probing means (not shown) on the upper probe plate 40 may be pressed against the printed circuit board 11 to be tested with any desired degree of probe deflection to assure good contact between the probing means and the printed circuit board 11 being tested. One manner of assuring good contact between the probing means and the printed circuit board 11 is to lower the upper probe plate 40 to a predetermined position which is a defined distance away from the lower probe plate 42. The defined distance is such that the probing means of the upper probe plate 40 firmly contact the desired contact areas on the top of the printed circuit board 11 under test and the probing means 47 of the lower probe plate 42 firmly contact the desired contact areas on the bottom of the printed circuit board 11.

An RS-232 data link preferably exists between a controller (not shown) and the printed circuit board test facility 103. The data link is used to download the operating environment to the printed circuit board test facility 103. The data link is also used to input data regarding the type of printed circuit board being tested. This data includes, for example, maximum component height, the distance travelled by the conveyor belt after the printed circuit board has passed over an optical beam sensor, and probing heights required for multiple stage probing. The printed circuit board test facility 103 communicates to the controller regarding proper position of the printed circuit board, proper orientation of the printed circuit board, etc.

The printed circuit board test facility 103 is adapted to move a printed circuit board 11 from a production or assembly conveyor or printed circuit board magazine to a position over the test head of an in-circuit or functional tester. Once the printed circuit board 11 is in the test fixture apparatus 10, the probe plates 40, 42, make appropriate electrical contact with the printed circuit board 11 to perform any necessary testing. After the testing, the conveyor 27 transports the printed circuit board 11 outside the test fixture apparatus 10 (e.g., to a position on the opposite side of the test fixture apparatus 10 or to a position on the same side as it started from).

FIG. 6 illustrates a perspective view of a preferred manner in which the upper probe plate 40 is adapted to be moved vertically in a very precise and controlled manner. The upper section 12 (shown in dotted lines) of the test fixture apparatus 10 is supported on upright members 16 which are threaded along substantially their entire length. The lower end of each upright member 16 is rotatably supported by the lower section (not shown) of the test fixture apparatus 10. The upper end of each upright member 16 threadably engages a block or housing 17 carried by the upper section 12.

The lower end of each upright support member 16 has attached to it a gear 18. An endless belt 19 is trained about each gear 18 as well as gear 20a of stepper motor 20, as illustrated. Thus, as the stepper motor 20 drives gear 20a, and hence belt 19, all of the upright support members 16 rotate in the same direction and in the same amount. Consequently, the upper section 12 (and the probe plate 40 carried by it) is moved vertically in a controlled manner. By programming the number of steps of motor 20, it is possible to very precisely determine and control the exact vertical position of the upper probe plate 40 relative to the lower probe plate 42.

Figure 7:
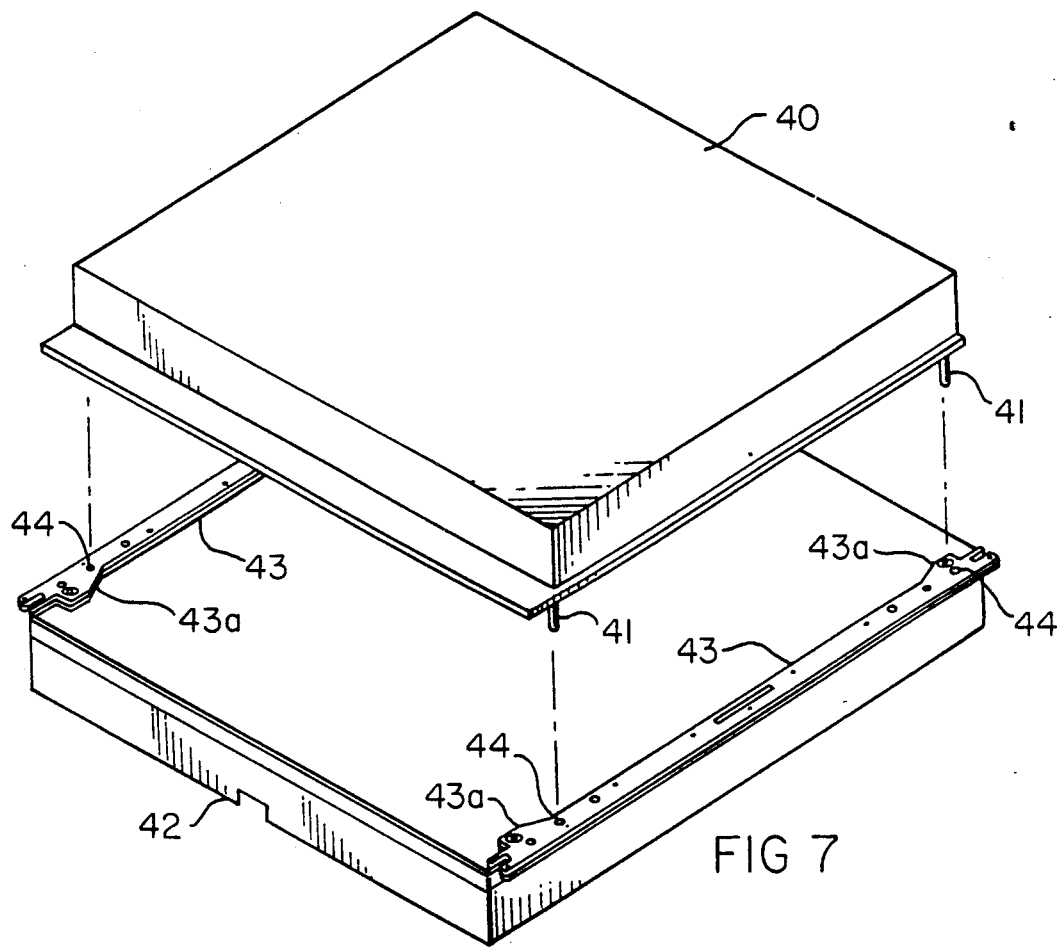
FIG. 7 illustrates an exploded view of a printed circuit board test fixture.

In FIG. 7 there is shown an exploded view of one embodiment of a test fixture cassette system for the probe plates. The upper probe plate is designated as 40 and the lower probe plate is designated as 42. The upper probe plate 40 includes downwardly extending posts 41 on opposite side edges. These downwardly extending posts 41 are adapted to be slidingly received in and engaged by latch means carried by the lower probe plate 42. In the embodiment shown in FIG. 7 there are two latch plates 43 along opposite side edges of the lower probe plate 42. Each latch plate 43 includes apertures 44 which are located so as to receive downwardly extending posts 41 when the upper 40 and lower 42 probe plates come together. Latch plates 43 are secured to lower probe plate 42 by means of brackets 43a. The end of each post 41 is tapered with a groove or channel cut into the post 41 just above the tapered end and extending completely around the post 41. The upper 40 and lower 42 probe plates are locked together by lowering upper probe plate 40 so that posts 41 enter the corresponding apertures 44 in latch plate 43. The tapered end of posts 41 force apart two arms of a spring latch mechanism (not shown) until the arms of the spring latch mechanism are able to spring back towards each other in the groove of post 41. At this point, the posts 41 are latched to latch plate 43 of the lower probe plate 42, effectively locking upper 40 and lower 42 probe plates together. The mechanism is unlocked by the movement of rail 22 into position against lower probe plate 42. Tabs on rail 22 force the latch mechanism into a position where the arms of the spring latch mechanism are disengaged from the groove in post 41.

Figure 8:
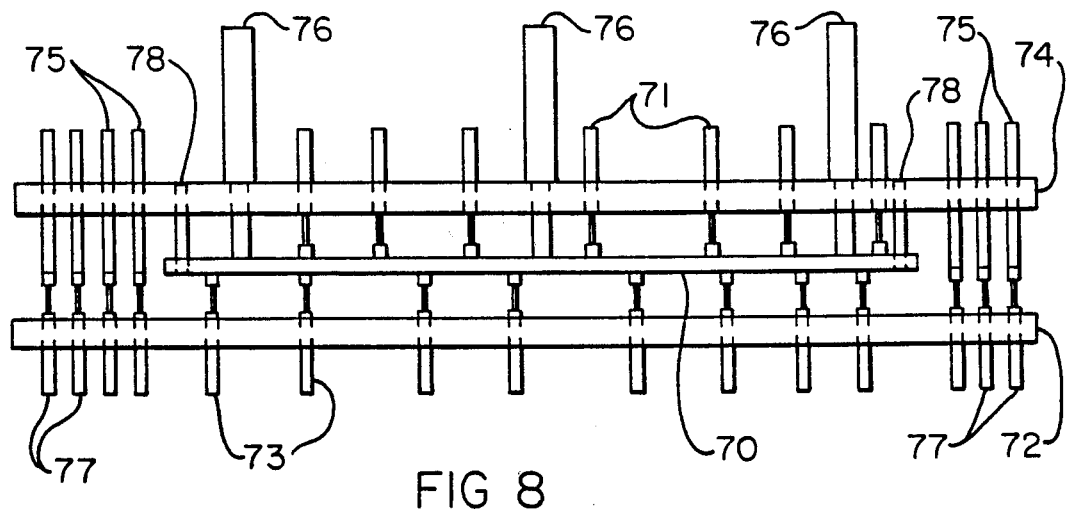
FIG. 8 illustrates an end view of a printed circuit board positioned between two sets of probes in a printed circuit board test fixture.

FIG. 8 illustrates a printed circuit board 70 being tested on both top and bottom sides in the test fixture apparatus 10. The upper probe plate 74 includes probing means 71, pushers 76, reference pins 78, and transfer pins 75. The lower probe plate 72 includes probing means 73 and transfer pins 77. The transfer pins 77 of the lower probe plate 72 align with the transfer pins 75 of the upper probe plate 74 and serve to transfer appropriate electrical signals from the lower probe plate 72 to the upper probe plate 74. The transfer pins 75 are connected to the upper probing means 71 using wire wrapping techniques.

The force exerted by the lower probes 73 on the printed circuit board 70 must be greater than the force exerted on the printed circuit board 70 by the upper probes 71. When this condition is met, the pushers 76 determine the plane of the printed circuit board.

Automated Test Fixture Retrieval Apparatus Architecture

The automated test fixture storage and retrieval apparatus of the automated changer system consists of two major subsystems: printed circuit board test fixture transport apparatus 101 and an associated printed circuit board test fixture storage apparatus 102. FIG. 1 illustrates one of the many possible architectures of printed circuit board test fixture storage apparatus 102: three modular storage racks 111-113 arranged side by side in a cabinet-type of architecture. Each of the modular storage racks (ex 113) of printed circuit board test fixture storage apparatus 102 contains pairs of tracks 114 disposed vertically in an ordered arrangement. Each pair of tracks 114 are located one on either side of the opening in the face of the modular storage rack 113 in a fashion that the printed circuit board test fixture 115 can be inserted onto the tracks by the printed circuit board test fixture transport mechanism 101 as will be discussed below. The adjacent pairs of tracks 114 are vertically positioned such that the fixture changing mechanism 130 can enter the space between vertically juxtaposed printed circuit board test fixtures 115 to retrieve a test fixture 115.

The printed circuit board test fixture transport apparatus 101 is referenced to the printed circuit board test fixture storage apparatus 102 and is located in juxtaposed position to one side of the printed circuit board test fixture 103. There is an aperture (not shown) in the side of printed circuit board test fixture 103 that faces the automated changer system for printed circuit board test fixtures. It is through this aperture that the printed circuit board test fixture is loaded into the printed circuit board test facility 103.

Test Fixture Transport Apparatus

The printed circuit board test fixture transport apparatus 101 is controlled by signals received from the printed circuit board test facility controller (not shown) to precisely regulate the positioning and operation of the test fixture changing mechanism 130. The printed circuit board test fixture transport apparatus 101 consists of a vertical 117 and a horizontal 118 member arranged perpendicular to each other in an xy coordinate axis orientation. The use of an xy coordinate axis system permits precise positioning of the mechanism and the use of a simple mechanism that is both cost-effective and high speed in operation. Each of the members 117, 118 consists of a rigid frame 121 to which end plates (ex 122) are attached at either end. Between the two end plates and attached thereto are a pair of guide rods 124, 125 and a threaded rod 126 arranged midway between the two guide rods 124, 125. Attached to the guide rods 124, 125 and the threaded rod 126 is the fixture changing mechanism 130 that includes a pair of fixture changing arms 131, 132. The fixture changing arms 131, 132 function to retrieve and transport printed circuit board test fixtures between the printed circuit board test fixture storage apparatus 102 and the printed circuit board test facility 103. The fixture changing mechanism 130 includes a motor drive mechanism (not shown) connected to threaded rod 126 that functions to operate fixture changing mechanism 130 as an elevator mechanism to transpose fixture changing mechanism 130 in a vertical or y axis direction.

In similar fashion, the horizontal or x axis frame member 118 includes corresponding end plates, guide rods and threaded rod. Included in the base of the vertical frame member 117 is a motor drive mechanism as described above to transport the entirety of vertical frame member 117 and its associated fixture changing mechanism 130 in the horizontal or x axis direction. Thus, the two motor drive mechanisms, threaded rods and associated guide rods function to provide two elevator mechanisms, one operable in the horizontal or x axis direction, and the other operable in the vertical or y axis direction. Thus, as can be seen from this mechanism, fixture changing mechanism 130 is translatable in both the x and y axis directions to be oriented in front of any of the pairs of guides 114 located in the printed circuit board test fixture storage apparatus 102. The x and y axis mechanisms operate independent of each other thereby providing additional speed of operation in positioning fixture changing mechanism 130. Fixture changing mechanism 130 is also translatable in the x and y axis directions to be oriented in juxtaposed position to the test fixture loading aperture located in printed circuit board test facility 103. The exact position of fixture changing mechanism 130 can be determined by the use of, for example, a shaft encoder on the motor drive mechanism. This shaft encoder (not shown) provides an output signal that identifies the number of rotations of the associated motor, which signal can be used to determine the position of the fixture changing mechanism 130.

Test Fixture Replacement Operation

Figure 2:
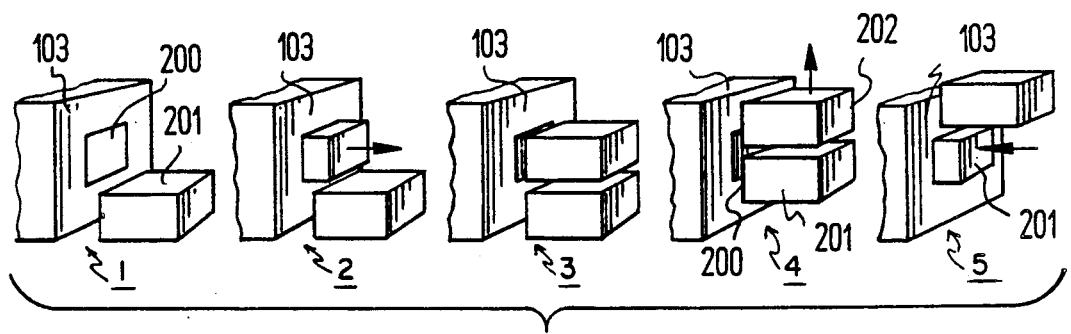
FIG. 2 illustrates a representation of the motion of a test fixture into the test facility.

FIG. 2 illustrates a typical sequence of motions of printed circuit board test fixture transport apparatus 101 to switch printed circuit board test fixtures in the printed circuit board test facility 103. In FIG. 2, printed circuit board test facility 103 is illustrated simply as a boxlike structure that includes an aperture 200 through which the printed circuit board test fixtures can be loaded and unloaded for use in the printed circuit board test fixture 103. FIG. 2 illustrates five diagrams numbered 1 through 5. These five diagrams illustrate the five primary steps taken by the automated changer in switching the printed circuit board test fixtures in the printed circuit board test facility 103. Diagram 1 illustrates the step wherein the printed circuit board test fixture transport apparatus 101 has retrieved the printed circuit board test fixture 201 from a predesignated position in the printed circuit board test fixture storage apparatus 102. The retrieved printed circuit board test fixture 201 has been transported and positioned in juxtaposed position next to printed circuit board test facility 103 and just below aperture 200. In step 2 illustrated as the second diagram in FIG. 2, the printed circuit board test fixture transport apparatus 102 retrieves the printed circuit board test fixture that was used in printed circuit board test facility 103. Diagram 3 illustrates the moment in time when printed circuit board test fixture transport apparatus 101 has retrieved the printed circuit board test fixture from printed circuit board test facility 103. At step 4, printed circuit board test fixture transport apparatus 101 translates in a vertical or y axis direction to remove the retrieved printed circuit board test fixture 202 away from aperture 200 and to instead locate printed circuit board test fixture 201 opposite aperture 200 for loading therein. The fifth diagram on FIG. 2 illustrates the insertion of the printed circuit board test fixture 201 that was retrieved from the storage apparatus 102 through aperture 200 into printed circuit board test fixture 103.

Test Fixture Retrieval Arm Mechanism

Figure 3:
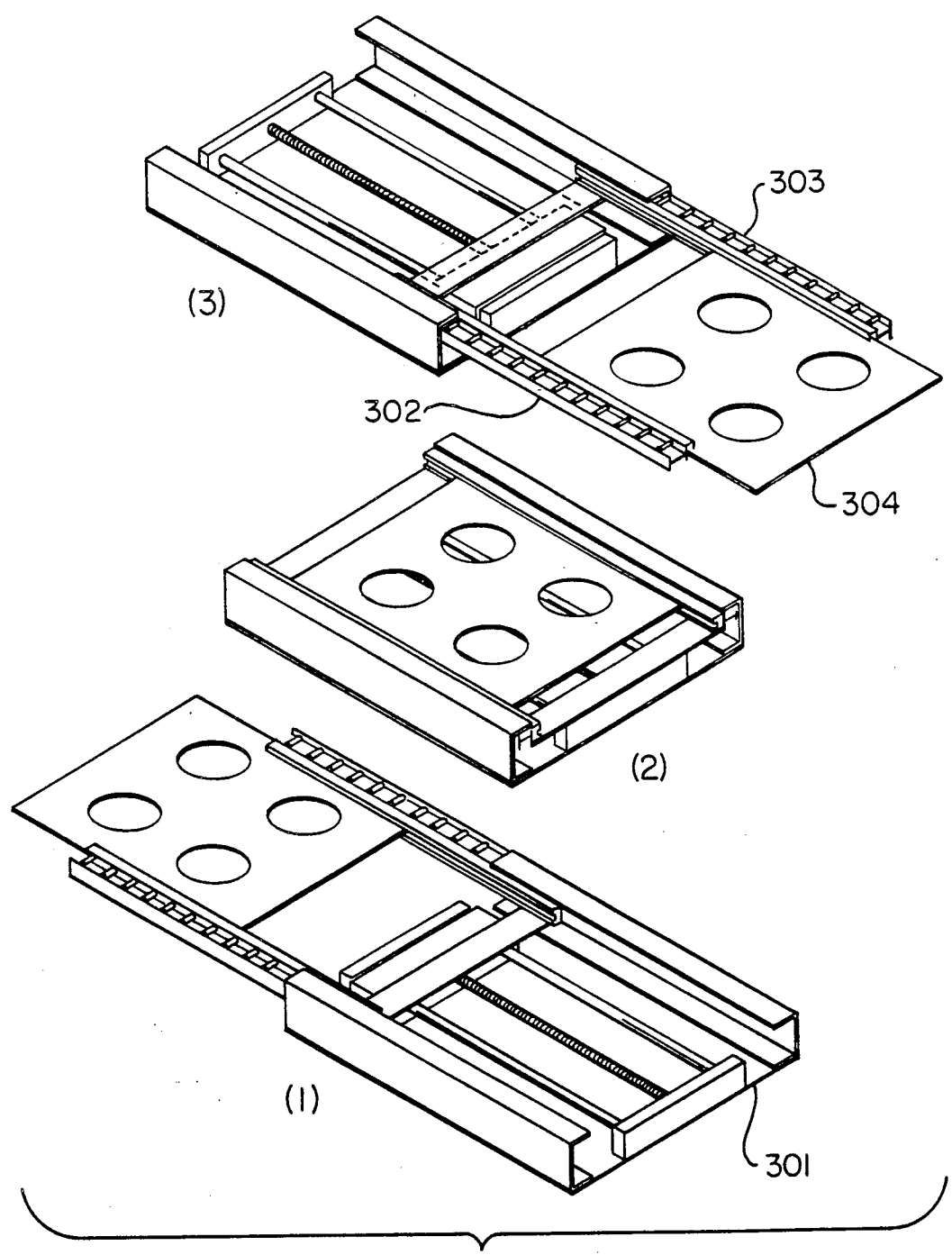
FIG. 3 illustrates a perspective view of a fixture retrieval mechanism in three different positions.

FIG. 3 illustrates three diagrams of the printed circuit board test fixture changing arm mechanism 131. It is to be understood that in the preferred embodiment, mechanism 130 has two fixture changing arm mechanisms 131 and 132 which function in the same manner and interchangeably. Either one of the fixture changing arms functions to retrieve the used test fixture cassette from the test system while the other fixture changing arm functions to retrieve a newly required test fixture cassette from the storage apparatus and insert the cassette into the tester so that a new fixture is ready and waiting to be installed while the old cassette is being removed. The first diagram labeled 1 on FIG. 3 illustrates the fixture changing arm 131 fully extended in the leftward direction, the second illustration in FIG. 3 shows the fixture changing arm 131 in the retracted position and the third illustration on FIG. 3 shows the fixture changing arm 131 in the fully extended position to the right. The fixture changing arm 131 illustrated in FIG. 3 consists of a frame 301 to which is attached a pair of extendable roller arms 302, 303 which carries a driven plate 304 from the retracted position illustrated in the second diagram of FIG. 3 to one of the two fully extended positions illustrated in diagrams 1 and 3 of FIG. 3.

Figure 4:
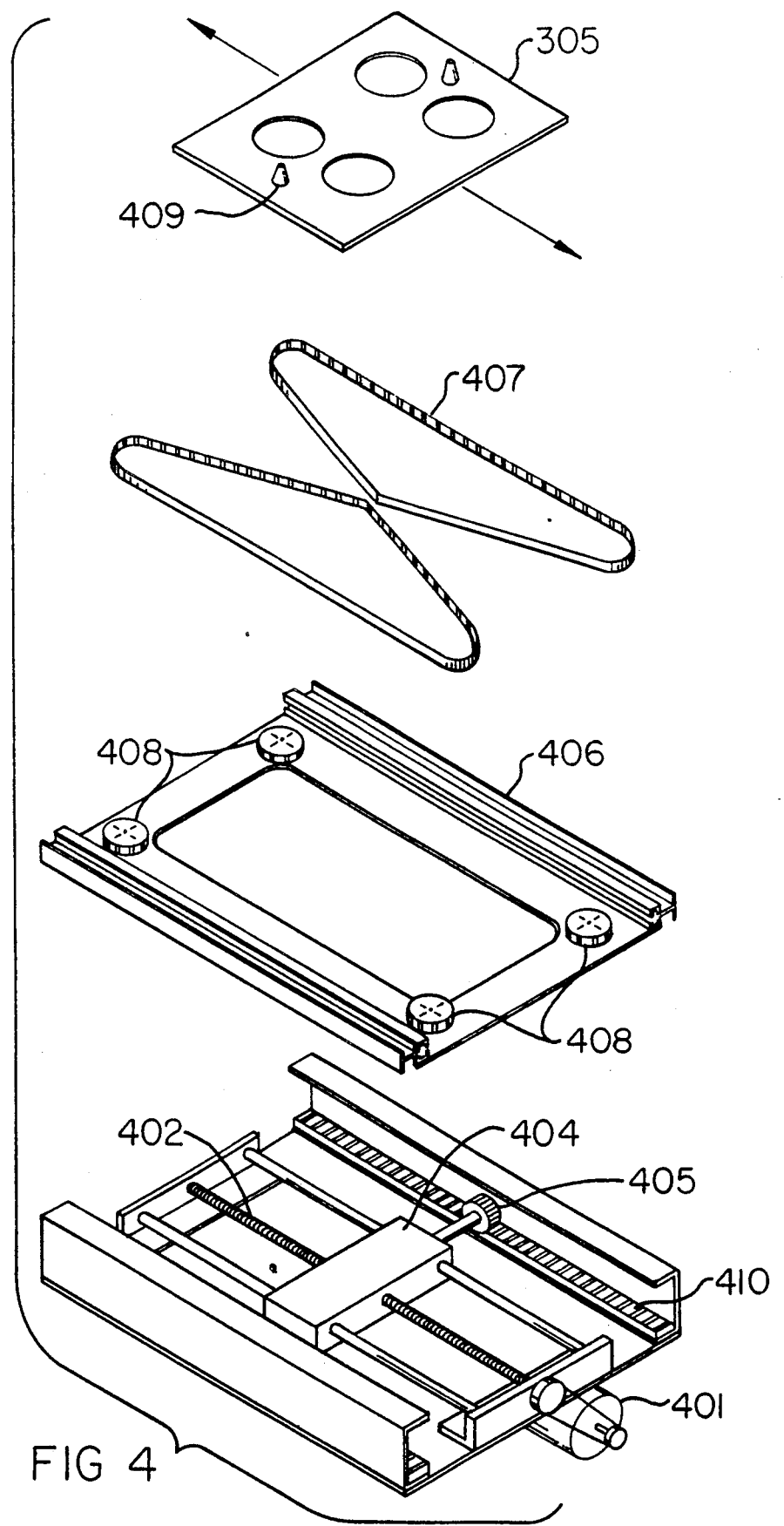
FIG. 4 illustrates an exploded view of the fixture retrieval mechanism.
Figure 4A:
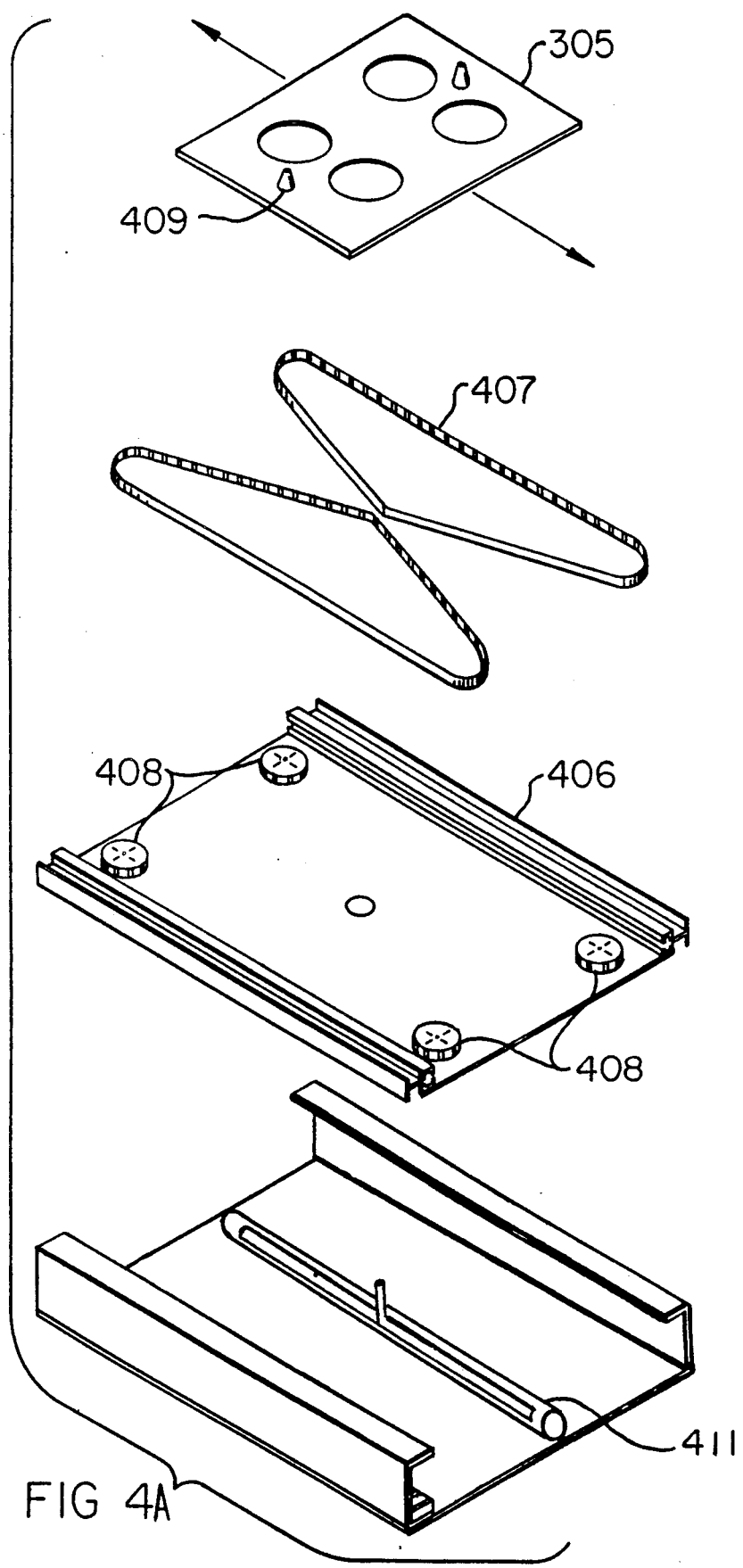
FIG. 4a illustrates another embodiment of a fixture retrieval mechanism.

FIG. 4 illustrates an exploded view of the fixture changing arm 131 illustrated in the perspective view of FIG. 3. A reversible servo motor 401 is used to provide the motive force to control the motion of the driven plate 305. Reversible servo motor 401 drives a ball screw 402 through a neoprene belt 407. Ball screw 402 drives a driving block 404 which in turn drives a pinon gear 405. The motion of the pinon gear 405 along rack 410 forces an intermediate plate 406 which has another rack (not shown) attached forward at a speed which is twice that of the driving block 404. A neoprene belt 407 is fixed to the driving belt and moves on pulleys 408 which are attached to the intermediate plate 406 and are driven by a gear rack attached to plate 406. The neoprene belt 407 is fixed to the driven plate 305 and causes it to move forward as illustrated in the fully extended positions. Driven plate 305 is used to grab one of the printed circuit board fixtures. The driven plate 305 has two indexing pins 409 located on its upper face. Another embodiment of the fixture changing arm 131 can consist of an air cylinder 411 as shown in FIG. 4a, hydraulic actuators, or other means know in the art, rather than motor and ball screw drives. Likewise, other driving motions could be used to drive plate 305 with respect to plate 406.

In operation, the fixture changing arm (ex 131) is extended to the fully extended position illustrated in FIG. 3, thereby positioning fixture changing arm 131 and driven plate 305 under the printed circuit board test fixture 115 to be retrieved. Once the fixture changing arm 131 is fully extended, vertical frame member 117 moves the entire retrieval arm mechanism 131 slightly upward, nesting the indexing pins 409 into corresponding registration holes in the bottom surface of the printed circuit board test fixture. The printed circuit board test fixture is then pulled from either the storage location in the printed circuit board test fixture storage apparatus 102 or from within the printed circuit board test fixture 103. It should be apparent to those skilled in the art that grabbing and capturing the fixture by the use of indexing pins and corresponding registration holes is not required. Other methods of grabbing and capturing the printed circuit board test fixture may be employed within the spirit and scope of the invention. The driven plate 305 of the fixture changing arm 131 is cantilevered when extended and unable to support a great deal of vertical force. However, the weight of the printed circuit board test fixture is approximately 40 pounds and is such that it does not over stress the mechanism illustrated in FIG. 4. In addition, the fixture changing arm 131 rests on the grooves in the test head or tracks 114 in printed circuit board test fixture storage apparatus 102 to thereby support the distal end of the fixture changing arm 131. Once the printed circuit board test fixture has been pulled from its storage location, the driven plate 305 moves to the centered position illustrated by diagram 2 of FIG. 3, where it is in position for the retrieved printed circuit board test fixture to be relocated to the printed circuit board test facility 103.

Operational Steps of Test Fixture Retrieval

In further detail, the above described test fixture retrieval operation consists of the following steps:

1. The controller determines or is instructed that a different type of printed circuit board is to be tested by printed circuit board test facility 103.
2. The controller determines what test fixture is required to test this different type of printed circuit board.
3. The controller identifies the storage location in test fixture storage apparatus 102 that houses the required test fixture.
4. The controller signals test fixture transport apparatus 101 to retrieve the required test fixture from the identified storage location.
5. Test fixture transport apparatus 101 positions fixture changing arm 132 opposite the required test fixture in its storage location in test fixture storage apparatus 102.
6. Fixture changing arm 132 is inserted below the required test fixture.
7. Vertical member 117 is activated by the controller to move fixture changing arm 132 in an upward (y axis) direction to nest the indexing pins 409 of fixture changing arm 132 into corresponding registration holes in the bottom surface of the test fixture.
8. Fixture changing arm 132 is retracted to retrieve the required test fixture from its storage location in test fixture storage apparatus 102.
9. Transport apparatus 101 relocates the retrieved test fixture adjacent to the aperture in printed circuit board test facility 103.
10. The controller instructs rails 22, 24 of the conveyor system of fixturing apparatus 10 to retract by moving away from each other along the rail supports.
11. The upper section 12 of fixturing apparatus 10 is lowered until posts 41 of upper probe plate 40 become latched in the latch system of lower probe plate 42 to form a single piece test fixture cassette.
12. The test fixture cassette is released from the test head and raised by upper section 12 moving upward.
13. The test fixture cassette is unlatched by raising upper section 12 to its upper limit, thereby releasing L-shaped locking pins 55 from the test fixture cassette.
14. Fixture changing arm 131 is inserted through the aperture in the printed circuit board test facility 103 into position below the test fixture cassette.
15. Vertical member 117 is activated by the controller to move fixture changing arm 131 in an upward (y axis) direction to nest the indexing pins 409 on fixture changing arm 131 into corresponding registration holes in the bottom surface of the test fixture cassette.
16. Fixture changing arm 131 is retracted to retrieve the test fixture cassette from printed circuit board test facility 103.
17. Vertical member 117 is activated by the controller to position fixture changing arm 132, that holds the test fixture cassette previously retrieved from printed circuit board test fixture storage apparatus 102, in position juxtaposed with the aperture in printed circuit board test facility 103.
18. Fixture changing arm 132 is extended to load the test fixture cassette into fixturing apparatus 10 of the printed circuit board test facility 103 via the aperture therein.
19. The vertical member 117 lowers fixture changing arm 132 a sufficient distance to remove the indexing pins 409 of fixture changing arm 132 from the corresponding registration holes in the bottom surface of the test fixture cassette, leaving the test fixture cassette resting on the L-shaped pins 55.
20. Fixture changing arm 132 is retracted from the printed circuit board test facility 103.
21. Upper section 12 of the fixturing apparatus 10 is lowered to move the test fixture cassette downward until it is latched in place on the test head.
22. Rail 22 of the conveyor system of fixturing apparatus 10 is moved inwardly toward the lower probe plate 42 to release the latch mechanism that holds upper 40 and lower 42 probe plates together in the test fixture cassette.
23. Upper section 12 of the fixturing apparatus 10 is raised to move the upper probe plate 40 in an upward direction.
24. Rail 24 is moved toward rail 22 until it reaches a mechanical stop member carried on lower probe plate 42 which defines the board width for printed circuit boards to be tested by the new test fixture.

25. After step 16 above, test fixture transport apparatus 101 relocates fixture changing arm 131 that holds the test fixture cassette retrieved from printed circuit board test facility 103 opposite the storage location in printed circuit board test fixture storage apparatus 102 designated for this test fixture.

26. Fixture changing arm 131 is extended to load the test fixture cassette on to tracks 114 in test fixture storage apparatus 102.

27. Vertical member 117 is activated to lower fixture changing arm 131 a sufficient distance to remove the indexing pins 409 of fixture changing arm 131 from the corresponding registration holes in the bottom surface of the test fixture cassette, leaving the test fixture resting on tracks 114.

28. Fixture changing arm 131 is retracted from test fixture storage apparatus 102.

29. End of operation.

The automated changer for printed circuit board test fixtures thereby efficiently and automatically changes printed circuit board test fixtures. The plurality of test fixtures are stored in a storage apparatus for the robotic retrieval therefrom by a test fixture transport apparatus. The transport apparatus translates a retrieved test fixture into position opposite the test fixture load/unload aperture in the printed circuit board test facility. A test fixture changing arm automatically replaces the test fixture presently in the test facility with the retrieved test fixture. The automated changer system completes the test fixture installation by unlatching the test fixture plates and locking the test fixture in place. Thus, all the operations are automatically performed by the apparatus of the invention without human intervention.

While a specific embodiment of this invention has been disclosed herein, it is expected that those skilled in the art can design other embodiments that differ from this particular embodiment but fall within the scope of the appended claims.

I claim:

1. A method of automatically loading dual element printed circuit board test fixtures in a printed circuit board test facility having a printed circuit board tester having a test head thereon, said printed circuit board test facility having an aperture for loading dual element printed circuit board test fixtures therein, comprising the steps of:
   retrieving a selected one of a stored plurality of dual element printed circuit board test fixtures from storage apparatus that stores said plurality of dual element printed circuit board test fixtures, wherein the two elements of said dual element printed circuit board test fixtures are latched together to form a single test fixture unit;
   transporting said retrieved latched dual element printed circuit board test fixture unit to a position opposite said aperture in said printed circuit board test facility;
   inserting said retrieved latched dual element printed circuit board test fixture unit into said printed circuit board test facility via said aperture;
   automatically locking said dual element retrieved printed circuit board test fixture unit into said printed circuit board test facility; and
   automatically unlatching said retrieved dual element printed circuit board test fixture unit.

2. The method of claim 1 wherein said step of retrieving includes the step of:
   entering a predetermined space between two of said latched dual element printed circuit board test fixture units to retrieve the selected one of said latched dual element printed circuit board test fixture units.

3. The method of claim 2, wherein said step of retrieving further includes the step of:
   moving a retrieval arm into juxtaposed position against said selected latched dual element printed circuit board test fixture unit to engage said selected latched dual element printed circuit board test fixture unit.

4. The method of claim 3 wherein said step of retrieving includes the step of:
   retracting said retrieval arm from said predetermined space between said two latched dual element printed circuit board test fixture units to withdraw said selected latched dual element printed circuit board test fixture unit from said storage apparatus.

5. The method of claim 3 wherein said step of retrieving further includes the step of:
   moving said retrieval arm into juxtaposed position opposite said printed circuit board test facility aperture to insert said selected latched dual element printed circuit board test fixture unit therein.

6. The method of claim 1 wherein said step of transporting includes the step of:
   translating said retrieval arm in x and y coordinate axis directions to access the printed circuit board test fixture unit storage locations in said storing apparatus.

7. The method of claim 6 wherein said step of translating includes the step of:
   x-axis positioning of said retrieving arm in an x-axis direction to position said retrieving arm opposite any selected one of said printed circuit board test fixture locations in said storing apparatus and said aperture in said printed circuit board test facility.
   y-axis positioning of said retrieving arm in an y-axis direction to position said retrieving arm opposite any selected one of said printed circuit board test fixture locations in said storing apparatus and said aperture in said printed circuit board test facility.

8. The method of claim 1 wherein said step of locking includes the step of:
   moving said retrieved dual element printed circuit board test fixture unit to said test head on said printed circuit board tester.

9. The method of claim 8 wherein said step of moving includes the step of:
   rotating a plurality of upright support members, each in a same direction and a same amount, to precisely vertically align said test head reactive to said dual element printed circuit board test fixture unit.

10. The method of claim 1 wherein said step of locking includes the steps of:
    lowering apparatus in said printed circuit board tester to move said retrieved dual element printed circuit board test fixture unit downward to latch said dual element printed circuit board test fixture unit in place on said test head;
    wherein said step of automatically unlatching includes moving an actuator inwardly toward said dual element printed circuit board test fixture unit to activate said step of unlatching to release said two elements of said dual element printed circuit board test fixture;

raising said apparatus to move one element of said dual element printed circuit board test fixture unit upward from the second element of said dual element printed circuit board test fixture unit.

11. A method of automatically loading/unloading dual element printed circuit board test fixtures in a printed circuit board test facility having a printed circuit board tester having a test head thereon and the printed circuit board test facility having an aperture for loading/unloading said dual element printed circuit board test fixtures therein comprising the steps of:

retrieving a selected one of a stored plurality of latched dual element printed circuit board test fixtures from a storing apparatus wherein the two elements of said dual element printed circuit board test fixtures are latched together to form a single test fixture unit;

transporting said retrieved latched dual element printed circuit board test fixture unit to a position adjacent to said printed circuit board test facility;

unlocking a dual element printed circuit board test fixture unit, that is presently in said printed circuit board tester, from said test head;

extracting said dual element printed circuit board test fixture unit that is presently in said printed circuit board tester via said aperture;

inserting said retrieved latched dual element printed circuit board test fixture unit into said printed circuit board tester via said aperture;

locking said retrieved dual element printed circuit board test fixture unit into said printed circuit board tester;

automatically unlatching said retrieved dual element printed circuit board test fixture unit.

12. The method of claim 11 wherein said step of inserting includes the step of:

repositioning said retrieved latched dual element printed circuit board test fixture unit opposite said aperture in said printed circuit board test facility.

13. The method of claim 11 wherein said step of locking includes the step of:

moving said retrieved dual element printed circuit board test fixture unit to said test head on said printed circuit board tester.

14. The method of claim 13 wherein said step of moving includes the step of:

rotating a plurality of upright support members, each in a same direction and a same amount, to precisely vertically align said test head reactive to said dual element printed circuit board test fixture unit.

15. The method of claim 13 wherein said step of locking includes the steps of:

lowering apparatus in said printed circuit board tester to move said retrieved dual element printed circuit board test fixture unit downward to latch said dual element printed circuit board test fixture unit in place on said test head;

wherein said step of automatically unlatching includes moving an actuator inwardly toward said dual element printed circuit board test fixture unit to activate said step of unlatching to release said two elements of said dual element printed circuit board test fixture;

raising said apparatus to move one element of said dual element printed circuit board test fixture unit upward from the second element of said dual element printed circuit board test fixture unit.

* * * * *